United States Patent [19]
Ciarlo

[11] Patent Number: 4,891,255
[45] Date of Patent: Jan. 2, 1990

[54] (110) ORIENTED SILICON WAFER LATCH ACCELEROMETER AND PROCESS FOR FORMING THE SAME

[75] Inventor: Dino R. Ciarlo, Livermore, Calif.

[73] Assignee: The United States of America as represented by the United States Department of Energy, Washington, D.C.

[21] Appl. No.: 250,591

[22] Filed: Sep. 29, 1988

[51] Int. Cl.[4] ........................ B32B 3/10; G01P 15/00; H01L 21/306; B44C 1/22

[52] U.S. Cl. ...................................... 428/131; 73/488; 73/517 R; 156/644; 156/647; 156/657; 156/659.1; 156/662; 428/137

[58] Field of Search ............ 156/644, 647, 657, 659.1, 156/662; 428/131, 134, 137; 73/488, 510, 517 R, 726, 754; 357/26, 55, 60; 338/2, 4, 42, 47; 29/621.1

[56] References Cited

U.S. PATENT DOCUMENTS

| | | | |
|---|---|---|---|
| 4,600,934 | 7/1986 | Aine et al. | 156/647 X |
| 4,670,092 | 6/1987 | Motamedi | 156/647 X |
| 4,732,647 | 3/1988 | Aine | 156/633 |
| 4,776,924 | 10/1988 | Delapierre | 156/647 |
| 4,783,237 | 11/1988 | Aine et al. | 437/15 |

*Primary Examiner*—William A. Powell
*Attorney, Agent, or Firm*—Michael B. K. Lee; L. E. Carnahan; William R. Moser

[57] ABSTRACT

A method for etching a (110) silicon wafer to produce latching cantilever beams, which bend parallel to the surface of the wafer. The resulting apparatus is also part of the invention.

20 Claims, 5 Drawing Sheets

(110) ORIENTED SILICON WAFER LATCH ACCELEROMETER AND PROCESS FOR FORMING THE SAME

BACKGROUND OF THE INVENTION

The U.S. Government has rights in this invention pursuant to Contract No. W-7405-ENG-48 between the U.S. Department of Energy and the University of Calif., for the operation of Lawrence Livermore National Laboratory.

It is known that silicon etchants have different etch rates that are dependent upon the orientation of the etching direction. In the prior art most etching of silicon is done on (100) (using Miller indices notation) oriented silicon wafers. A description of Miller indices notation can be found in "Introduction to Solid State Physics," by Charles Kittel, 3rd Ed., John Wiley and Sons, 1967, pp 21, 22 incorporated by reference. U.S. Pat. No. 4,071,838 is an example of an accelerometer which is etched from a (100) silicon wafer. Because of the orientation of the (111) plane with respect to the (100) plane, grooves in (100) silicon wafer tend to etch in a V-shape, causing the etched cantilevers to have a trapezoidal cross-section and, causing them to bend perpendicularly to the wafer plane. This type of bending would not be helpful in producing the inventive latch accelerometer. Some methods in the prior art require an etch stop. An example of such a method is disclosed in U.S. Pat. No. 4,600,934 issued on July 15, 1986, which requires undercutting an etch stop.

U.S. Pat. No. 4,284,862 discloses a latch accelerometer. A latch accelerometer is a switch which closes if accelerated by a certain acceleration in a certain direction, and remains closed after the acceleration ceases. The patented apparatus requires a few mechanical parts, and is relatively expensive to build. Also it would be difficult tó build a large number of such devices that are uniform.

SUMMARY OF THE INVENTION

An object of the invention is to provide an inexpensive latch accelerometer.

Another object of the invention is to provide a large number of uniform latch accelerometers.

Another object of the invention is to provide a silicon wafer latching accelerometer.

Another object of the invention is to provide a method for etching cantilevers in a silicon wafer, which does not require an etch stop.

Another object of the invention is to provide a method for etching cantilevers in a silicon wafer, wherein the cantilevers are parallel to and bend parallel to the surface of the wafer and wherein the cantilevers are not all parallel to each other.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

The invention provides a (110) silicon wafer, etched to provide at least two cantilever beams which are not parallel to each other, yet are parallel to the surface of the wafer and are able to bend in a direction parallel to the surface of the wafer.

BRIEF DESCRIPTION OF THE DRAWINGS

The accompanying drawings, which are incorporated and form a part of the specification, illustrate embodiments of the invention and, together with the description, serve to explain the principles of the invention.

DESCRIPTIONS OF THE PREFERRED EMBODIMENTS

Figure 1A:
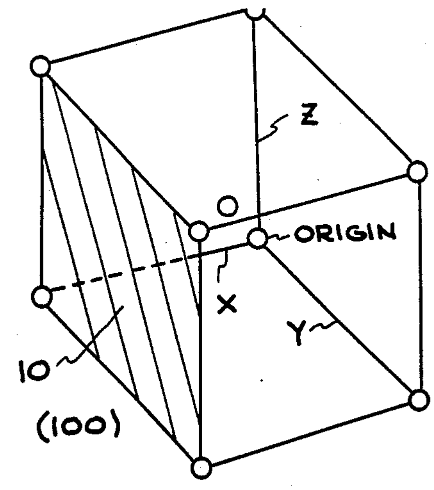
FIGS. 1A, 1B, and 1C are illustrations of a silicon crystal.
Figure 1B:
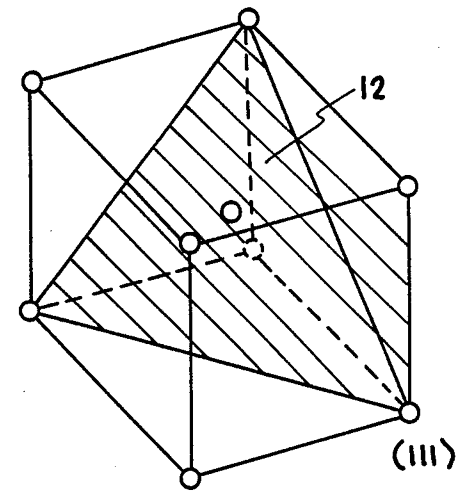
Figure 1C:
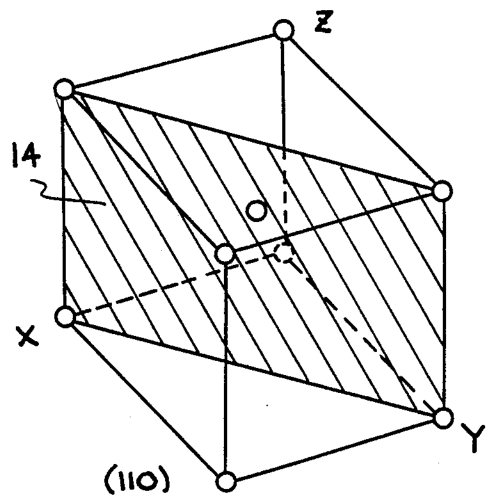

FIGS. 1A, 1B, and 1C are illustrations of unit cells in a silicon crystal, with axes X, Y and Z and an origin as shown. A unit cell in a silicon crystal has a silicon atom at each corner of a cube and a silicon atom at the center of the cube. This is called a body-centered cubic. FIG. 1A is an illustration of a unit cell with the (100) plane 10 shaded. The (100) plane 10 and equivalent planes lie along a face of a unit cube, so that there would be six such planes for each unit cube. Planes that are equivalent to the (100) plane would become the (100) plane 10 with the proper rotation or translation of the coordinate system. FIG. 1B is an illustration of a unit cell with the (111) plane 12 shaded. The (111) plane 12 and equivalent planes intersect only three corner atoms of the unit cube and would not pass through the center oft he unit cube. There are eight such planes for each unit cube. FIG. 1C is an illustration of a unit cell with the (110) plane 14 shaded. The (110) plane 14 and equivalent planes intersect four corner atoms and the center atom of the unit cube.

The etch rate ratios of 44% KOH for the crystal planes (110):(100):(111) are about 600:300:1. Although (100) wafer silicon is mostly what is used in etching in the prior art, a (110) silicon wafer is used in the invention, to allow etching of pits with parallel sides instead of the V-shape pits resulting from (100) silicon wafers. Pits with parallel sides can be etched in (110) silicon wafers, because there are four planes equivalent to the (111) plane that are perpendicular to the (110) plane. If the sides of the etch pits are along these planes, the sides of the etch pits can be etched yielding walls which are perpendicular to the (110) plane. For (100) wafers, none of the planes equivalent to the (111) plane are perpendicular to the (100) plane, so that the walls of the pits are angled yielding V-shape pits. The 600:1 etch rate ratio between the (110) plane and the (111) plane is significant in the inventive method which produces the inventive apparatus.

The first step, was to obtain a (110) silicon wafer. These wafers, which have their two flat surfaces parallel to the (110) plane, are readily available and can be purchased with the orientation of their edges in any desired position. A convenient position is to have the edges along (111) or equivalent planes which is perpendicular to the (110) surface. In addition, various ways of growing or cutting such a crystal is described in "Vertical Etching Of Silicon At Very High Aspect Ratios," by Don L. Kendall, Annual Review of Material Science, Vol. 9, 1979 pp. 373–403, which is incorporated by reference.

It was important to properly align the wafer. This was done by masking a small portion on the perimeter of the wafer with a mask having a plurality of lines at different angles from each other. The lines were etched, and then studied to observe the amount of undercutting for each line. The line with the least amount of undercutting, thus yielding the thinnest etch groove, was the most closely parallel to the (111) plane or an equivalent plane. Further discussion of alignment procedures can be found in the above cited article by Don L. Kendall which has been incorporated by reference. In the preferred embodiment, the lines in the mask were 3 mm long and 8 microns wide, and they fanned out at an angle of 0.1 degrees. The masking and etching were done near the perimeter of the wafer and then etched 100 microns into the wafer surface. If two masks were made on opposite sides of a 2 inch wafer, and by using a contact mask aligner with split field alignment optics, the crystal can be aligned to better than 0.05 degrees.

Figure 2:
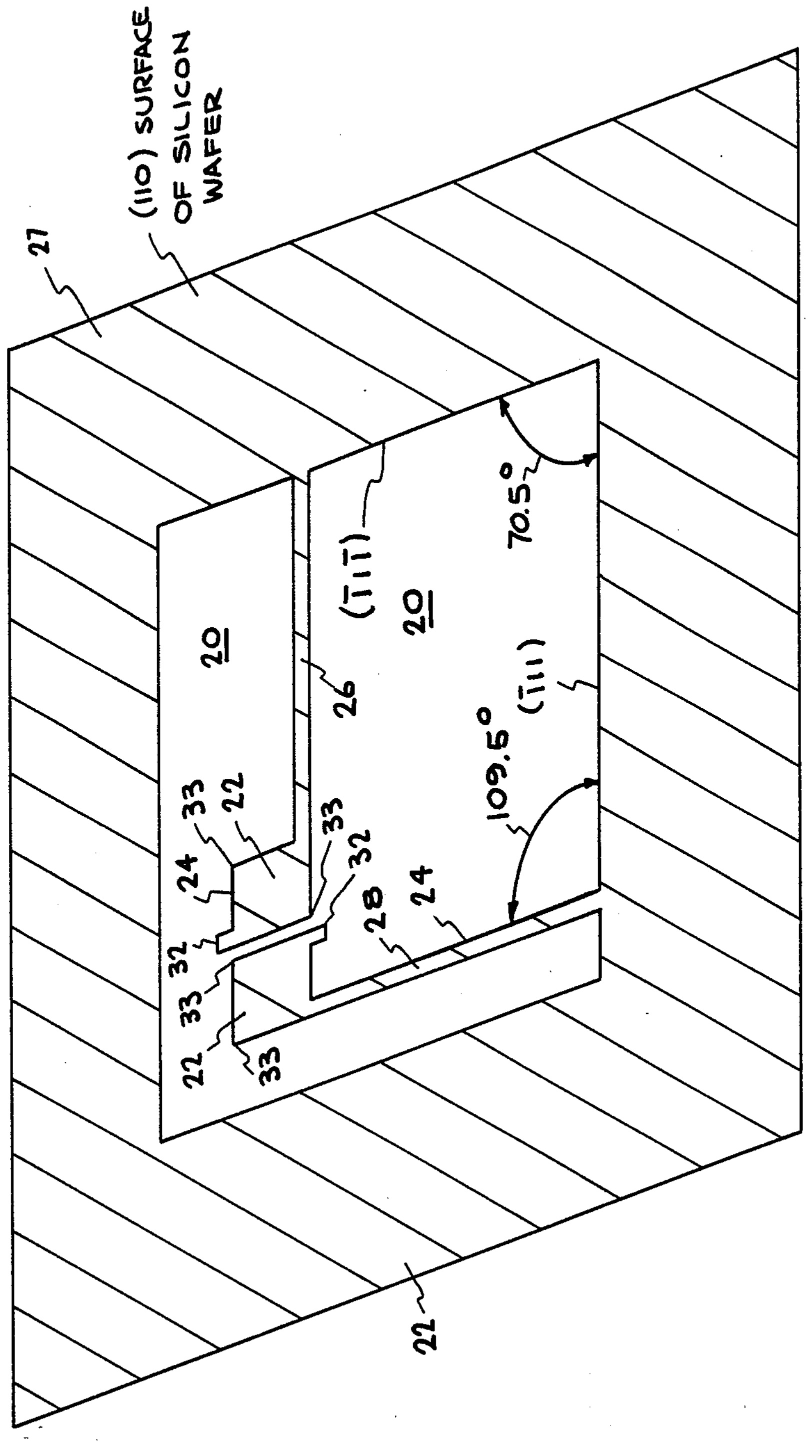
FIG. 2 is a drawing of a mask used in the preferred embodiment of the invention.

After the proper (111) alignment was found, the (110) silicon wafer was next masked. FIG. 2 is an illustration of a masked (110) silicon wafer used in the preferred inventive method to create the preferred embodiment of the invention. In the preferred method, a 400 Angstroms thick silicon nitride mask was used. The masked areas 22 are indicated by the shading. Unshaded areas 20 indicate locations on the wafer that were not masked. The unmasked areas 20 would be the areas exposed to the etchant. The borders 24 are the lines between the masked areas 22 and the unmasked areas 20. The borders 24 were aligned so that they were parallel to the line of intersection between the (110) surface and the (111) or equivalent planes which are perpendicular to the (110) surface. This means that the mask was made so that borders 24 are not perpendicular to each other. Instead the angles between border lines were 70.5° or 109.5°. In the preferred embodiment, the mask was designed to provide a first cantilever 26 and a second cantilever 28 and a frame 27. In the preferred embodiment the cantilevers had corner compensated areas 32 to prevent the rounding of specified outer corners. In addition, some parts of the cantilevers had outer corners 33 that lacked corner compensation. In the preferred embodiment, the silicon wafer was two inches in each dimension parallel to the surface, and 150 microns thick. The wafer was masked on both sides so that it could be etched from both sides.

Figure 3:
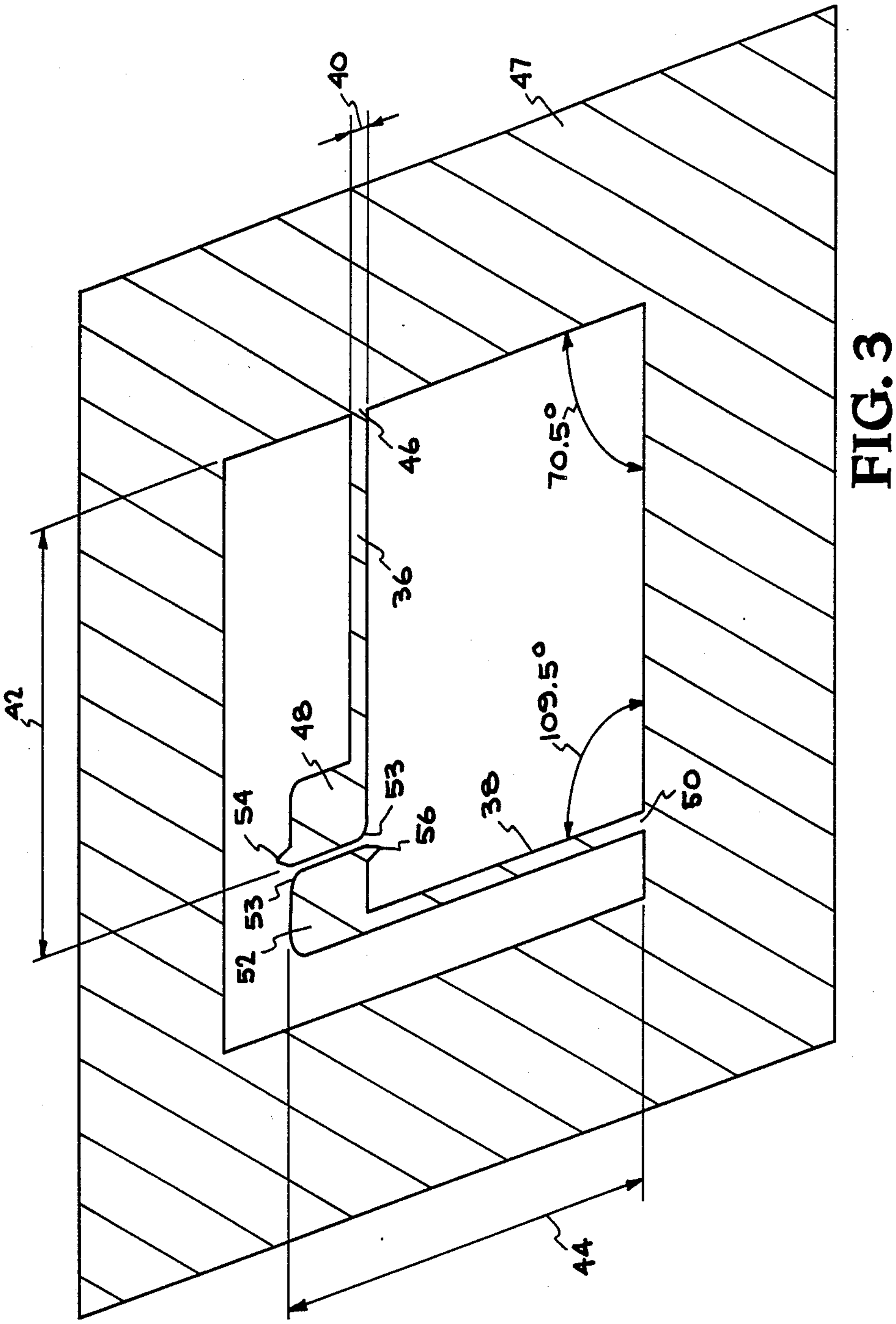
FIG. 3 is a drawing of the preferred embodiment of the invention.

FIG. 3 is an illustration of a resulting silicon wafer after it was etched. As mentioned before, the silicon wafer was 150 microns thick. The etching produced a first cantilever 36 and a second cantilever 38. The length of the first cantilever, which is designated by 42, was on the order of 4,000 microns. The width of the first cantilever was the thickness of the silicon wafer, which is 150 microns. The thickness of the first cantilever, which is designated by 40, was 20 microns. One unique aspect of the invention, is that the thickness of the first cantilever, which is designated by 40, and the length of the first cantilever, which is designated by 42, are in directions that are parallel to the surface of the silicon wafer and the width of the first cantilever is in a direction that is substantially perpendicular to the surface of the wafer. The length is defined as greater than the width, and the width is defined as greater than the thickness. This allowed the first cantilever to bend most easily in a direction parallel to the surface of the wafer.

The length of the second cantilever, which is designated by 44, was on the order of 2,000 microns. As with the first cantilever 36, a unique aspect of the second cantilever is that its length and thickness are in directions which are parallel to the surface of the wafer and it has a width which is the thickness of the wafer, which is substantially perpendicular to the surface of the wafer. This allowed the second cantilever 38 to bend in a direction which is substantially parallel to the surface of the wafer. The direction of the length of the second cantilever 44 forms an angle with the direction of the length of the first cantilever 42, wherein the angle has a value of substantially 109.5° or 70.5°. This is to allow the edges of both cantilevers to be parallel to the (111) or equivalent planes. In the preferred embodiment, the angle between the direction of the length of the first cantilever 42 and the direction of the length of the second cantilever 44 was 70.5°.

Another unique aspect of the preferred embodiment is that it provides two cantilevers with lengths that are not substantially parallel and which bend in a direction parallel to the wafer surface. This is required for the two cantilevers on the same wafer surface to latch together. The first cantilever 36 was attached to the frame 47 at one end 46 and enlarged at the other end 48, which was the free end. The second cantilever 38 was attached to the frame 47 at one end 50 and enlarged at the other end 52. The enlarged parts of the cantilevers, 48 and 52, caused the cantilevers to bend more easily when accelerated. On the part of the enlargement of the first cantilever 48 where the mask was corner compensated a peak 54 resulted. On the part of the enlargement of the second cantilever 52 where the mask was corner compensated a peak 56 resulted. The outer corners which lacked corner compensation became rounded corners 53 when they were etched.

Figure 4:
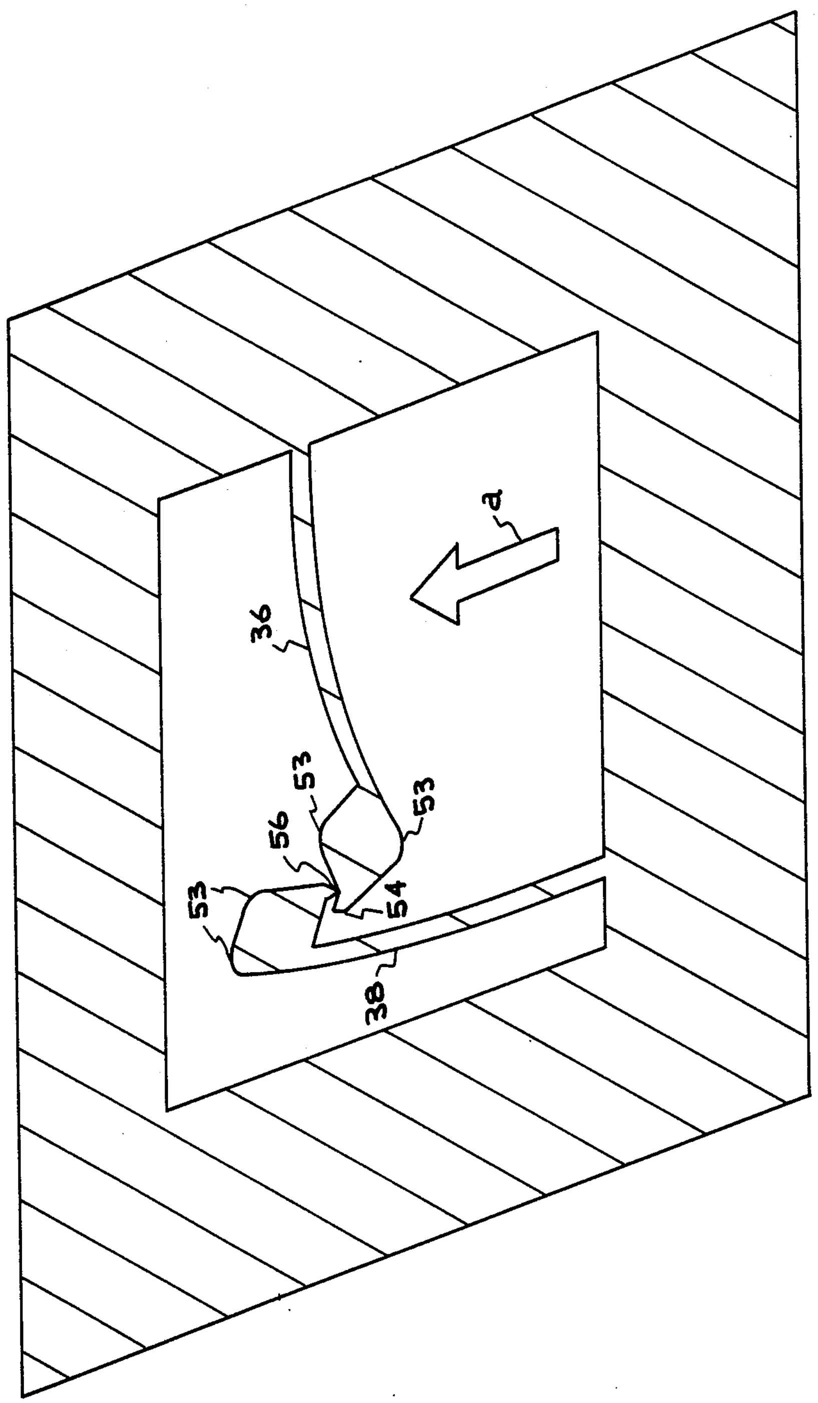
FIG. 4 is a drawing of the preferred embodiment of the invention when latched.

FIG. 4 is a view of the preferred embodiment when the cantilevers are latched. An acceleration with a strong enough component in the direction "a" as shown will cause the first cantilever 36 to bend in the direction opposite to "a" and the second cantilever 38 to move in a direction slightly opposite to "a" causing the first cantilever 36 to latch to the second cantilever 38, as shown. Peak 54 of the first cantilever 36 latches to peak 56 of the second cantilever 38. If the cantilevers formed regular corners instead of peaks, the cantilevers may or may not latch together. If those corners lacked corner compensation, then they would have probably become rounded like the rounded corners 53. Such rounded corners would not latch together, making corner compensation necessary.

The significance of the latching aspect is that the device can be used to record whether or not a certain acceleration was applied to the mechanism without requiring battery voltage. Later a voltage powered sensor could be used to determine whether or not they are latched. One of several conventional techniques could be used to apply an electrical conductor to the cantilevers, so that when the cantilevers are latched they close an electrical circuit. In the alternative, an optical or capacitive device could sense the position of the cantilevers. One use for such a latch accelerometer is in a safety mechanism for artillery shells. Firing of a certain artillery shell could subject the shell to an acceleration of 40,000 g's. Then it would be desirable to build a latch accelerometer which will latch when it experiences an acceleration of 40,000 g's. The latching is necessary, since in many cases, artillery shells do not use active electrical batteries. Instead they use wet cell batteries which are activated by an appropriate acceleration to generate voltage. Since the acceleration caused by the firing is of short duration, it is usually completed before the wet cells are mixed enough to create the required voltage. By using a latch accelerometer, the acceleration can be recorded even without battery voltage. When the wet cells are sufficiently mixed they can then apply a voltage across the cantilevers to determine whether they are latched. Under normal handling, movement would not cause the wet cell battery to mix and produce a voltage, because the artillery shell must first be armed manually. The ability to create uniform latch accelerometers allows the accelerometers to be built so that they would latch at predetermined g's. If the shell is dropped or shocked in a way that it experiences very high g's such as 100,000 g's but of extremely short duration, the accelerometer will not latch, because the cantilever arms cannot travel far enough during this short length of time. Since thousands of shells could be required, building an inexpensive latch accelerometer would be desirable.

Figure 5:
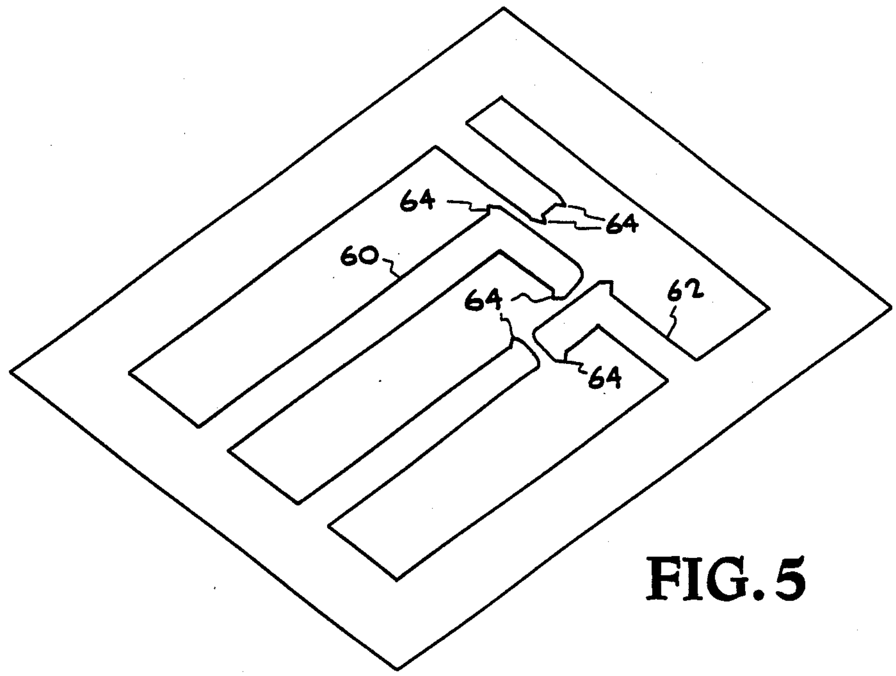
FIG. 5 is a drawing of another embodiment of the invention.
Figure 6:
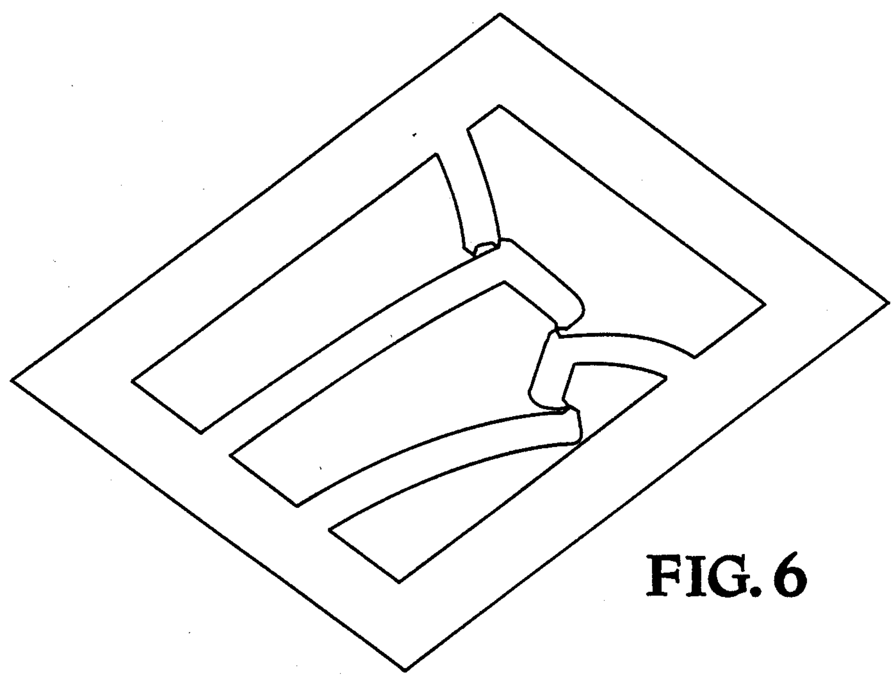
FIG. 6 is a drawing of the embodiment shown in FIG. 5 when latched.

FIG. 5 is an illustration of another embodiment of the invention which uses four cantilevers. This embodiment is also etched on a (110) silicon wafer. Corner compensation methods are used to make peaks 64. All other edges are made parallel to the (111) or equivalent planes A first cantilever 60 is not parallel to a second cantilever 62. FIG. 6 is an illustration of the embodiment with the cantilevers latched.

The foregoing description of a preferred embodiment of the invention has been presented for purposes of illustration and description. It is not intended to be exhaustive or to limit the invention to the precise form disclosed, and obviously many modifications and variations are possible in light of the above teaching. The embodiment was chosen and described in order to best explain the principles of the invention and its practical application to thereby enable others skilled in the art to best utilize the invention in various embodiments and with various modifications as are suited to the particular use contemplated. Changes and modifications in the specifically described embodiments can be carried out without departing from the scope of the invention which is intended to be limited only by the scope of the appended claims.

I claim:

1. An apparatus, comprising:

a (110) silicon wafer with a thickness, comprising:

a frame;

a first cantilever beam, with a first end attached to the frame and a second end, which is a free end which is not attached to the frame, and with a length dimension from the first end to the second end, and a thickness, wherein the length and the thickness are substantially parallel to the (110) plane, and a width substantially perpendicular to the (110) plane and substantially equal to the thickness of the wafer;

a second cantilever beam, with a first end attached to the frame and a second end, which is a free end which is not attached to the frame, and with a length dimension from the first end to the second end, and a thickness, wherein the length and the thickness are substantially parallel to the (110) plane, and a width substantially perpendicular to the (110) plane and substantially equal to the thickness of the wafer, and where the length of the first cantilever forms an angle with the length of the second cantilever, where the value of the angle is substantially 70.5° or 109.5°.

2. An apparatus as recited in claim 1, wherein the first cantilever further comprises at least one outer corner with a corner compensated peak.

3. An apparatus as recited in claim 2, wherein the second cantilever further comprises at least one outer corner with a corner compensated peak.

4. An apparatus as recited in claim 2, wherein the second end of the first cantilever is enlarged.

5. An apparatus as recited in claim 3, wherein the second end of the first cantilever is enlarged.

6. An apparatus as recited in claim 5, wherein the second end of the second cantilever is enlarged.

7. An apparatus as recited in claim 2, wherein the (110) silicon wafer is made of a plurality of silicon unit cells, and wherein each edge of the first cantilever, except for the corner compensated peaks is substantially along a plane that intersects only three corners of each unit cell through which the plane passes.

8. An apparatus as recited in claim 7, wherein each edge of the second cantilever, except for the corner compensated peaks is substantially along a plane that intersects only three corners of each unit cell through which the plane passes.

9. An apparatus as recited in claim 7, wherein the second end of the first cantilever is the closest part of the first cantilever to the second cantilever and the second end of the second cantilever is the closest part of the second cantilever to the first cantilever.

10. A method for manufacturing a frame and first and second silicon cantilevers, wherein the cantilevers have a first end which is attached to the frame and a second end not attached to the frame and wherein each cantilever has a length from the first end of the cantilever to the second end of the cantilever and wherein the length of the first cantilever is not parallel to the length of the second cantilever, and wherein the first and second cantilevers bend in the plane of the frame, comprising:

making a silicon wafer, which has first and second surfaces on opposite sides, and wherein the two surfaces are parallel to the (110) plane, and wherein the silicon wafer is made of a plurality of silicon unit cells;

masking the silicon wafer on the first surface so that there is a masked area, and an unmasked area of the silicon wafer and a border between the masked area and the unmasked area, wherein the masked area forms patterns for a frame and at least two cantilevers, wherein each border between the masked and the unmasked area is substantially along a plane that intersects only three corners of each unit cell through which the plane passes, and wherein each of the cantilever patterns each have a first end which is attached to the frame pattern and a second end, which is a free end which is not attached to the frame pattern and wherein each of the cantilever patterns has a length from the first end of the cantilever pattern to the second end of the cantilever pattern and wherein the length of the first cantilever pattern is not parallel to the length of the second cantilever pattern; and exposing the silicon wafer to an anisotropic etchant.

11. A method as recited in claim 10, wherein the masked area forming the cantilever patterns also contains at least one masked area for corner compensation.

12. A method as recited in claim 10, further comprising the step of, masking the second surface, and wherein the silicon wafer is etched on the first and second surfaces.

13. A method as recited in claim 10, wherein the masking step applies a silicon nitride mask on the order of 400 angstroms.

14. A method as recited in claim 10, wherein the step of exposing the silicon wafer to an etchant uses KOH as the etchant.

15. A (110) silicon wafer latching apparatus, comprising:

frame a first cantilever beam, with a first end attached to the frame and a second end, which is a free end which is not attached to the frame, and with a length dimension from the first end to the second end, and a thickness, wherein the length and the thickness are substantially parallel to the (110) plane, and a width substantially perpendicular to the (110) plane and substantially equal to the thickness of the wafer and which comprises at least one outer corner which has a corner compensated peak;

a second cantilever beam, with a first end attached to the frame and a second end, which is a free end which is not attached to the frame, and with a length dimension from the first end to the second end, and a thickness, wherein the length and the thickness are substantially parallel to the (110) plane, and a width substantially perpendicular to the (110) plane and substantially equal to the thickness of the wafer, and where the length of the first cantilever forms an angle with the length of the second cantilever, where the value of the angle is substantially 70.5° or 109.5° and which comprises at least on outer corner which has a corner compensated peak to allow the first cantilever to be latched to the second cantilever.

16. An apparatus as recited in claim 15, wherein the second end of the first cantilever is enlarged.

17. An apparatus as recited in claim 16, wherein the second end of the second cantilever is enlarged.

18. An apparatus as recited in claim 15, wherein the (110) silicon wafer is made of a plurality of silicon unit cells, and wherein each edge of the first cantilever, except for the corner compensated peaks, is substantially along a plane that intersects only three corners of each unit cell through which the plane passes.

19. An apparatus as recited in claim 18, wherein each edge of the second cantilever, except for the corner compensated peaks, is substantially along a plane that intersects only three corners of each unit cell through which the plane passes.

20. An apparatus as recited in claim 19, wherein the second end of the first cantilever is the closest part of the first cantilever to the second cantilever and the second end of the second cantilever is the closest part of the second cantilever to the first cantilever.

* * * * *